(12) United States Patent
Gao

(10) Patent No.: US 11,837,304 B2
(45) Date of Patent: Dec. 5, 2023

(54) DETECTION CIRCUIT

(71) Applicant: CHANGXIN MEMORY TECHNOLOGIES, INC., Hefei (CN)

(72) Inventor: Enpeng Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/806,003

(22) Filed: Jun. 8, 2022

(65) Prior Publication Data

US 2023/0317194 A1    Oct. 5, 2023

Related U.S. Application Data

(63) Continuation of application No. PCT/CN2022/088846, filed on Apr. 24, 2022.

(30) Foreign Application Priority Data

Apr. 2, 2022  (CN) .......................... 202210346526.X

(51) Int. Cl.
*G11C 29/00*  (2006.01)
*G11C 29/36*  (2006.01)
(52) U.S. Cl.
CPC .................................... *G11C 29/36* (2013.01)
(58) Field of Classification Search
CPC ...................................................... G11C 29/36
See application file for complete search history.

(56) References Cited

U.S. PATENT DOCUMENTS 4,649,537 A * 3/1987 Rosswurm .......... G06F 11/0763
                                                    714/25
5,790,564 A * 8/1998 Adams .................... G11C 29/36
                                                   714/738

(Continued)

FOREIGN PATENT DOCUMENTS

CN         1198834 A      11/1998
CN       101504600 A       8/2009

(Continued)

OTHER PUBLICATIONS

International Search Report cited in PCT/CN2022/088846 dated Dec. 30, 2022, 15 pages.

(Continued)

*Primary Examiner* — Uyen Smet
(74) *Attorney, Agent, or Firm* — Cooper Legal Group, LLC

(57) ABSTRACT

The present disclosure provides a detection circuit, including: a generation unit provided with a plurality of output terminals and configured to generate random detection data and output one bit of the random detection data through each output terminal; a first drive unit provided with a plurality of first input terminals connected to the plurality of output terminals of the generation unit in one-to-one correspondence and a plurality of output terminals connected to a memory array, and configured to transmit the random detection data to the memory array, wherein the memory array is configured to store the random detection data; and a comparison unit provided with a plurality of first input terminals connected to the plurality of output terminals of the generation unit in one-to-one correspondence and a plurality of second input terminals connected to the memory array.

15 Claims, 5 Drawing Sheets

(56) References Cited

U.S. PATENT DOCUMENTS

| 5,825,204 | A | 10/1998 | Hashimoto |
| 6,462,986 | B1 | 10/2002 | Khan |
| 8,539,278 | B2 | 9/2013 | Brewerton et al. |
| 9,905,288 | B2 | 2/2018 | Ryu et al. |
| 10,476,529 | B2 | 11/2019 | Cha et al. |
| 11,205,499 | B2 | 12/2021 | Ning |
| 2006/0107156 | A1* | 5/2006 | Lee .................. G11C 29/56 |
| | | | 714/739 |
| 2015/0187440 | A1* | 7/2015 | Hollis ............... G11C 29/022 |
| | | | 714/719 |
| 2016/0284390 | A1 | 9/2016 | Tomishima et al. |
| 2018/0130506 | A1 | 5/2018 | Kang et al. |
| 2019/0188165 | A1 | 6/2019 | Venkatraman et al. |
| 2022/0244863 | A1 | 8/2022 | Bhatia et al. |
| 2022/0269419 | A1 | 8/2022 | Kim |

FOREIGN PATENT DOCUMENTS

| CN | 101714412 A | 5/2010 |
| CN | 101840383 A | 9/2010 |
| CN | 102455967 A | 5/2012 |
| CN | 107240413 A | 10/2017 |
| CN | 108121672 A | 6/2018 |
| CN | 108153609 A | 6/2018 |
| CN | 108447520 A | 8/2018 |
| CN | 208240359 U | 12/2018 |
| CN | 110865909 A | 3/2020 |
| CN | 111427805 A | 7/2020 |
| CN | 113553277 A | 10/2021 |
| KR | 20050107291 A | 11/2005 |

OTHER PUBLICATIONS

International Search Report cited in PCT/CN2022/095119 dated Nov. 28, 2022, 10 pages.

International Search Report cited in PCT/CN2022/097377 dated Dec. 21, 2022, 8 pages.

Non-Final Office Action cited in Application No. U.S. Appl. No. 17/807,358, dated Mar. 21, 2023, 21 pages.

* cited by examiner

DETECTION CIRCUIT

CROSS-REFERENCE TO RELATED APPLICATIONS

This is a continuation of International Application No. PCT/CN2022/088846, filed on Apr. 24, 2022, which claims the priority to Chinese Patent Application No. 202210346526.X, titled "DETECTION CIRCUIT" and filed with the China National Intellectual Property Administration (CNIPA) on Apr. 2, 2022, the entire contents of both of which are incorporated herein by reference.

TECHNICAL FIELD

The present disclosure relates to, but is not limited to, a detection circuit.

BACKGROUND

At present, a dynamic random access memory (DRAM) technology develops rapidly, and mainly includes a synchronous dynamic random access memory (SDRAM), a double-data-rate two (DDR2) SDRAM, a double-data-rate three (DDR3) SDRAM, a double-data-rate four (DDR4) SDRAM, a double-data-rate five (DDR5) SDRAM, and other types.

However, the memory usually cannot implement fault detection on a storage function of a memory cell. In this case, when the memory is used to store data, the problem of data loss is likely to occur due to the inability to store the data.

SUMMARY

The present disclosure provides a detection circuit, including:
- a generation unit provided with a plurality of output terminals and configured to generate random detection data and output one bit of the random detection data through each output terminal;
- a first drive unit provided with a plurality of first input terminals connected to the plurality of output terminals of the generation unit in one-to-one correspondence and a plurality of output terminals connected to a memory array, and configured to transmit the random detection data to the memory array, where the memory array is configured to store the random detection data; and
- a comparison unit provided with a plurality of first input terminals connected to the plurality of output terminals of the generation unit in one-to-one correspondence and a plurality of second input terminals connected to the memory array, and configured to compare first read data read from the memory array with the random detection data generated by the generation unit to obtain a first comparison result.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and a person of ordinary skill in the art may still derive other drawings from these drawings without creative efforts.

DETAILED DESCRIPTION

To make the objectives, technical solutions, and advantages of the present disclosure clearer, the following clearly and completely describes the technical solutions in the present disclosure with reference to the accompanying drawings in the present disclosure. Apparently, the described embodiments are some but not all of the embodiments of the present disclosure. All other embodiments obtained by those of ordinary skill in the art based on the embodiments of the present disclosure without creative efforts should fall within the protection scope of the present disclosure.

Figure 1:
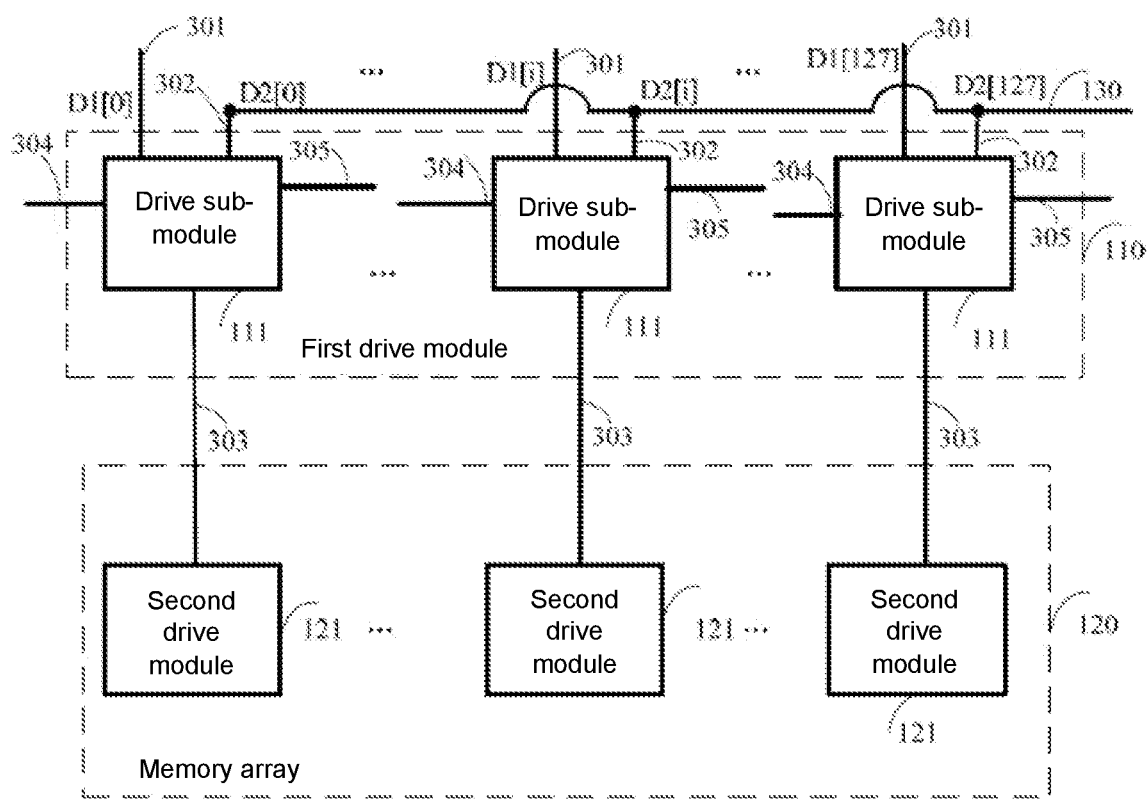
FIG. 1 is a schematic structural diagram of a memory according to one embodiment of the present disclosure.

As shown in FIG. 1, one embodiment of the present disclosure provides a memory. The memory includes a first drive module 110 provided with a plurality of first input terminals 301, a plurality of second input terminals 302, a plurality of first control terminals 304, a plurality of second control terminals 305, and a plurality of output terminals 303. The first drive module 110 is provided with the output terminals 303 connected to a target array 120, the plurality of first input terminals 301 for receiving first data D1, and the plurality of second input terminals 302 for receiving second data D2, and is configured to output the first data D1 or the second data D2 under the control of a control signal received by each of the first control terminals 304 and a control signal of each of the second control terminals 305, to make the target array 120 store the first data D1 or the second data D2.

The first data D1 includes multiple bits of data, and the second data D2 also includes multiple bits of data. The first data D1 includes a same number of bits as the second data D2. The number of bits of the first data D1 is the same as the number of the first input terminals 301 of the first drive module 110. The number of the first input terminals 301, the number of the second input terminals 302, the number of the first control terminals 304, the number of the second control terminals 305, and the number of the output terminals 303 in the first drive module 110 are the same. By setting in this way, each of the first input terminals 301 receives one bit of the first data D1, each of the second input terminals 302 receives one bit of the second data D2, and each of the output terminals 303 outputs one bit of the first data D1 under the control of a control signal of the corresponding first control terminal 304, or outputs one bit of the second data D2 under the control of a control signal of the corresponding second control terminal 305.

For example: if the first data D1 is 128-bit data, marked as D1[0: 127], the second data D2 is also 128-bit data, marked as D2[0: 127]. If there are 128 first input terminals 301 of the first drive module 110, each of the first input terminals 301 receives one bit of data D1[$i$], each of the second input terminals 302 receives one bit of data D2[i], and each of the output terminals 303 outputs one bit of data D1[i] in the first data D1 or one bit of data D2[i] in the second data D2. 0≤i≤127.

The first data D1 is data to be stored. That is, the first data D1 is determined according to data storage requirements. Each bit in the second data D2 is data "0" or data "1". That is, when the output terminals 303 of the first drive module output the first data D1, the data to be stored is written into the target array 120; and when the output terminals 303 of the first drive module output the second data D2, all "0" data or all "1" data is written into the target array 120.

Still referring to FIG. 1, the first drive module 110 includes a plurality of drive sub-modules 111. Each of the drive sub-modules 111 includes a first input terminal, a second input terminal, a first control terminal, a second control terminal, and an output terminal. One drive sub-module 111 is provided with the first input terminal as one of the first input terminals 301 of the first drive module 110, the second input terminal as one of the second input terminals 302 of the first drive module 110, the first control terminal as one of the first control terminals 304 of the first drive module 110, the second control terminal as one of the second control terminals 305 of the first drive module 110, and the output terminal as one of the output terminals 303 of the first drive module 110.

Each of the drive sub-modules 111 receives one bit of the first data D1 through the first input terminal thereof, and receives one bit of the second data D2 through the second input terminal thereof. Since the second data D2 is all "0" data or all "1" data, the second input terminal of each of the drive sub-modules 111 is connected to a second data transmission line 130, and the second data transmission line 130 simultaneously transmits data "0" or data "1" to the second input terminal of each of the drive sub-modules 111.

A DDR5 memory has a function of writing data, which is named as a Write function, and this function supports writing data to the target array 120. The function of writing data is triggered through the data write instruction wrt. The DDR5 memory also has a function of writing repeated data to reduce power consumption when writing repeated data, and this function is named as a Write X function. When the Write X function is enabled, a controller of the DDR5 memory can write random data without providing a clock (WCK) or data (DQ), so that a low-power-consumption write operation can be implemented, and all "0" or all "1" can be written to a corresponding internal address of the target array 120.

The Write X function is an optional characteristic of the DDR5 memory. The controller of the DDR5 memory can detect whether the Write X function is supported by reading a second operation bit OP[2] of a mode register MR21 (Mode Register, MR for short) and determining whether OP[2] is data "1". If a response result of a mode register read instruction (Mode Register Read, MRR for short) is "MR21 OP[2]=1", the controller of the DDR5 memory can set a sixth operation bit OP[6]=1 of the mode register MR21 through a mode register write instruction (Mode Register Write, MRW for short) to enable the Write X function.

The function of writing repeated data is triggered through a repeated data write instruction wrtX, which includes a column address strobe signal (Column Address Strobe, CAS for short) and a column address, where a value of each operation bit in a CAS is as follows: the operation bits DC0 to DC3 are all L, the operation bit WRX=H, the operation bit WXSA=H or L, and the operation bit WXSB=H or L. H represents a high level, and L represents a low level. When receiving the repeated data write instruction, all "0" data or all "1" data is written to the address corresponding to the target array 120.

When the first control terminal of each of the drive sub-modules 111 receives the data write instruction wrt, the output terminal of each of the drive sub-modules 111 outputs one bit of the first data D1 and transmits all bits of the first data D1 to the target array 120, and the target array 120 stores the first data D1. When the second control terminal of each of the drive sub-modules 111 receives the repeated data write instruction wrtX, the output terminal of each of the drive sub-modules 111 outputs one bit of the second data D2 and transmits all bits of the second data D2 to the target array 120, and the target array 120 stores the second data D2.

Figure 2:
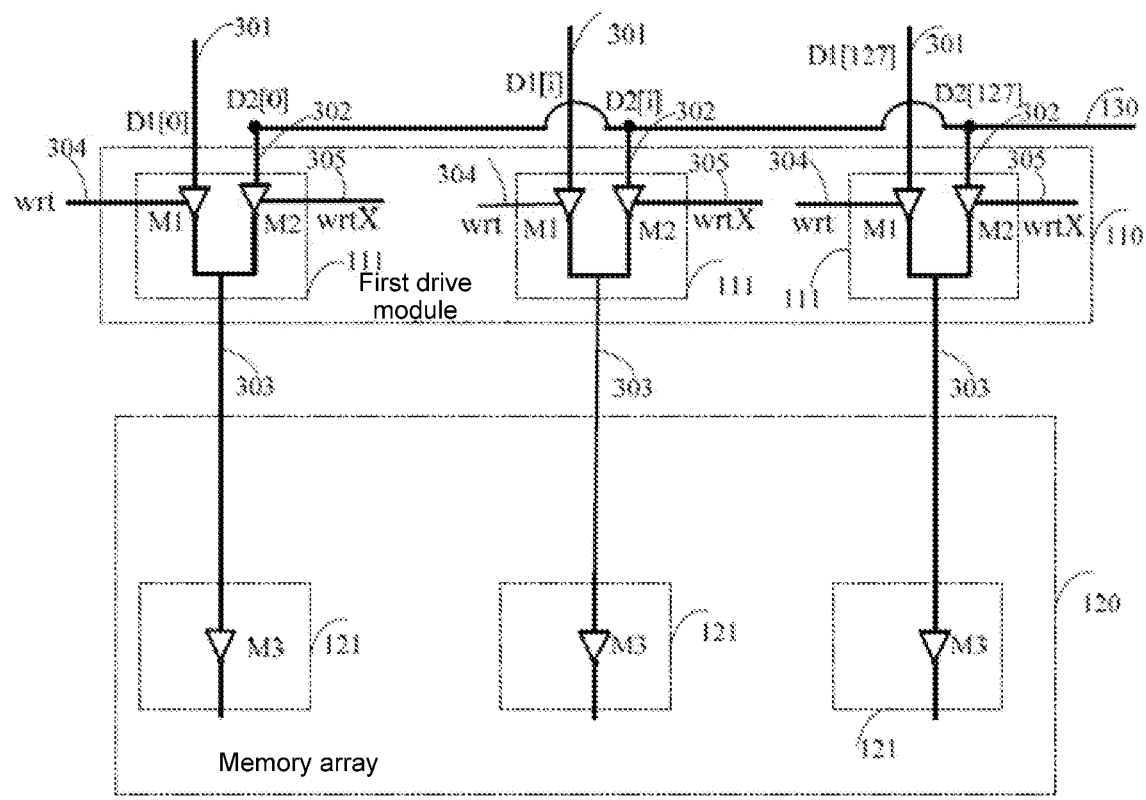
FIG. 2 is a schematic structural diagram of a memory according to another embodiment of the present disclosure.

Referring to FIG. 2, each of the drive sub-modules 111 includes a first gating inverter M1 and a second gating inverter M2. Each of the first gating inverter M1 and the second gating inverter M2 is provided with an input terminal, an output terminal, and a control terminal. The output terminal of the first gating inverter M1 is connected to the output terminal of the second gating inverter M2. The first gating inverter M1 is provided with the input terminal as the first input terminal of each drive sub-module 111, the control terminal as the first control terminal of each drive sub-module 111, and the output terminal as the output terminal of each drive sub-module 111. The second gating inverter M2 is provided with the input terminal as the second input terminal of each drive sub-module 111, and the control terminal as the second control terminal of each drive sub-module 111.

For each of the first gating inverters M1, when the first gating inverter M1 receives the data write instruction wrt, the input terminal of the first gating inverter M1 receives one bit of the first data D1, which is outputted from the output terminal, thereby implementing the transmission of the first data D1 through the plurality of first gating inverters M1. For each of the second gating inverters M2, the input terminals of the second gating inverters M2 are connected to the second data transmission line 130. When the second gating inverters M2 receive the repeated data write instruction, the second data transmission line 130 simultaneously transmits data "0" or data "1" to the input terminals of the drive sub-modules 111, and one bit of the second data D2 is outputted from the output terminals of the corresponding second gating inverters M2, thereby implementing the transmission of the second data D2 through the plurality of second gating inverters M2.

Still referring to FIG. 2, the target array 120 includes a plurality of second drive modules 121. Each of the second drive modules 121 includes an input terminal and an output terminal. One output terminal of the first drive module 110 is connected to the input terminal of one of the second drive modules 121. The second drive modules 121 are configured to transmit the data outputted by the first drive module 110, so that the data outputted by the first drive module 110 is stored into a memory cell of the target array 120.

Each drive module includes an inverter M3. Each inverter M3 includes an input terminal as the input terminal of each of the second drive modules 121, and an output terminal as the output terminal of each of the second drive modules 121. Each inverter M3 receives one bit of the first data D1 or one bit of the second data D2, which is outputted through the output terminal of each inverter M3 and then stored into each memory cell through bit lines in the target array 120.

In the foregoing technical solution, the data to be stored can be stored into the memory cell, and all "0" data or all "1" data can also be stored into the target array 120. However, the existing memory cannot implement fault detection on the storage function of the memory cell, so that when the memory is configured to store data, the problem of data loss due to the inability to store the data is likely to occur. To solve the above technical problems existing in the memory shown in FIG. 1, another embodiment of the present disclosure provides a detection circuit, configured to implement fault detection on the storage function of the memory.

Figure 3:
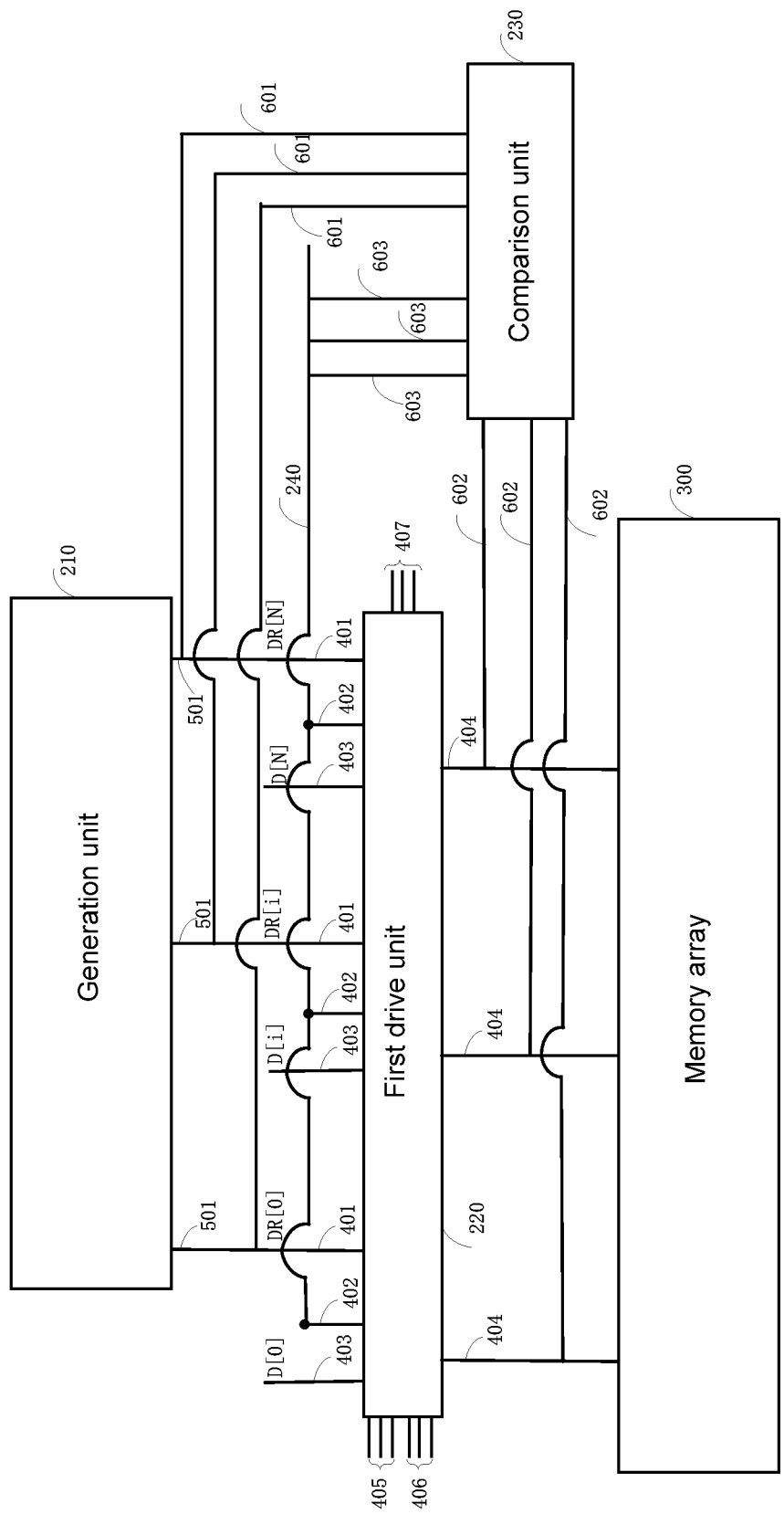
FIG. 3 is a schematic structural diagram of a detection circuit according to one embodiment of the present disclosure.

As shown in FIG. 3, another embodiment of the present disclosure provides a detection circuit. The detection circuit includes a generation unit 210, a first drive unit 220, and a comparison unit 230.

The generation unit 210 is provided with a plurality of output terminals 501. The first drive unit 220 is provided with a plurality of first input terminals 401 connected to the plurality of output terminals 501 of the generation unit 210 in one-to-one correspondence, and a plurality of output terminals 404 connected to a memory array 300.

The plurality of first input terminals 401 of the first drive unit 220 being correspondingly connected to the plurality of output terminals 501 of the generation unit 210 means that the first input terminals 401 of the first drive unit 220 are as many as the output terminals 501 of the generation unit 210, and one of the first input terminals 401 of the first drive unit 220 is connected to one of the output terminals 501 of the generation unit 210.

The generation unit 210 is configured to generate random detection data DR and output one bit Dr[i] in the random detection data DR through each output terminal 501. One of the first input terminals 401 of the first drive unit 220 is configured to receive one bit in the random detection data DR, so that the plurality of first input terminals 401 of the first drive unit 220 receive all bits in the random detection data DR. The first drive unit 220 outputs the random detection data DR through the output terminals 404 thereof. The memory array 300 receives the random detection data DR outputted by the plurality of output terminals 404 of the first drive unit 220, and stores the random detection data DR.

The comparison unit 230 is provided with a plurality of first input terminals 601 connected to the plurality of output terminals 501 of the generation unit 210 in one-to-one correspondence, and a plurality of second input terminals 602 connected to the memory array 300.

The plurality of first input terminals 601 of the comparison unit 230 being correspondingly connected to the plurality of output terminals 501 of the generation unit 210 means that the first input terminals 601 of the comparison unit 230 are as many as the output terminals 501 of the generation unit 210, and one of the first input terminals 601 of the comparison unit 230 is connected to one of the output terminals 501 of the generation unit 210.

One of the first input terminals 601 of the comparison unit 230 is configured to receive one bit in the random detection data DR generated by the generation unit 210, so that the plurality of first input terminals 601 of the comparison unit 230 receive the random detection data DR. The plurality of second input terminals 602 of the comparison unit 230 are configured to receive first read data read from the memory array 300. The comparison unit 230 is configured to compare the first read data read from the memory array 300 with the random detection data DR outputted by the generation unit 210 to obtain a first comparison result. When the first read data is consistent with the random detection data DR, the first comparison result is that the storage function of the memory array 300 is normal. When the first read data and the random detection data DR are inconsistent, the first comparison result is that the storage function of the memory array 300 is malfunctioning.

In the foregoing technical solution, the detection circuit includes: the generation unit 210 configured to generate the random detection data DR; the first drive unit 220 provided with the plurality of first input terminals 401 connected to the plurality of output terminals 501 of the generation unit 210 in one-to-one correspondence and the plurality of output terminals 404 connected to the memory array, and configured to transmit the random detection data DR to the memory array 300, where the memory array 300 is configured to store the data; and the comparison unit 230 configured to receive data read from the memory array 300, compare the first read data with the random detection data DR outputted by the generation unit 210 to obtain the first comparison result, and perform fault detection on the storage function of the memory array 300 according to the first comparison result.

In one embodiment, a function of writing random data is defined, and this function is marked as a Write R function. The function of writing random data refers to storing random data into the memory array 300. The function of writing random data is triggered through a random data write instruction wrtR. Defining the random data write instruction wrtR includes a column address strobe signal (Column Address Strobe, CAS for short) and a column address. As shown in Table 1, a value of each operation bit in a CAS is as follows: the operation bits DC0 to DC3 are all L, the operation bit WRX=H, the operation bit WXSA=H or L, and the operation bit WXSB=H or L. When receiving the random data write instruction wrtR, random data is written to an address corresponding to the memory array 300.

TABLE 1

Operation bits of CAS in random data write instruction

| | WS_WR | WS_RD | WS_FS | DC0-DC3 | WRX | WRXSA | WRXSB |
|---|---|---|---|---|---|---|---|
| WrtR | H | H | L | LLLL | H | V | V |

Figure 4:
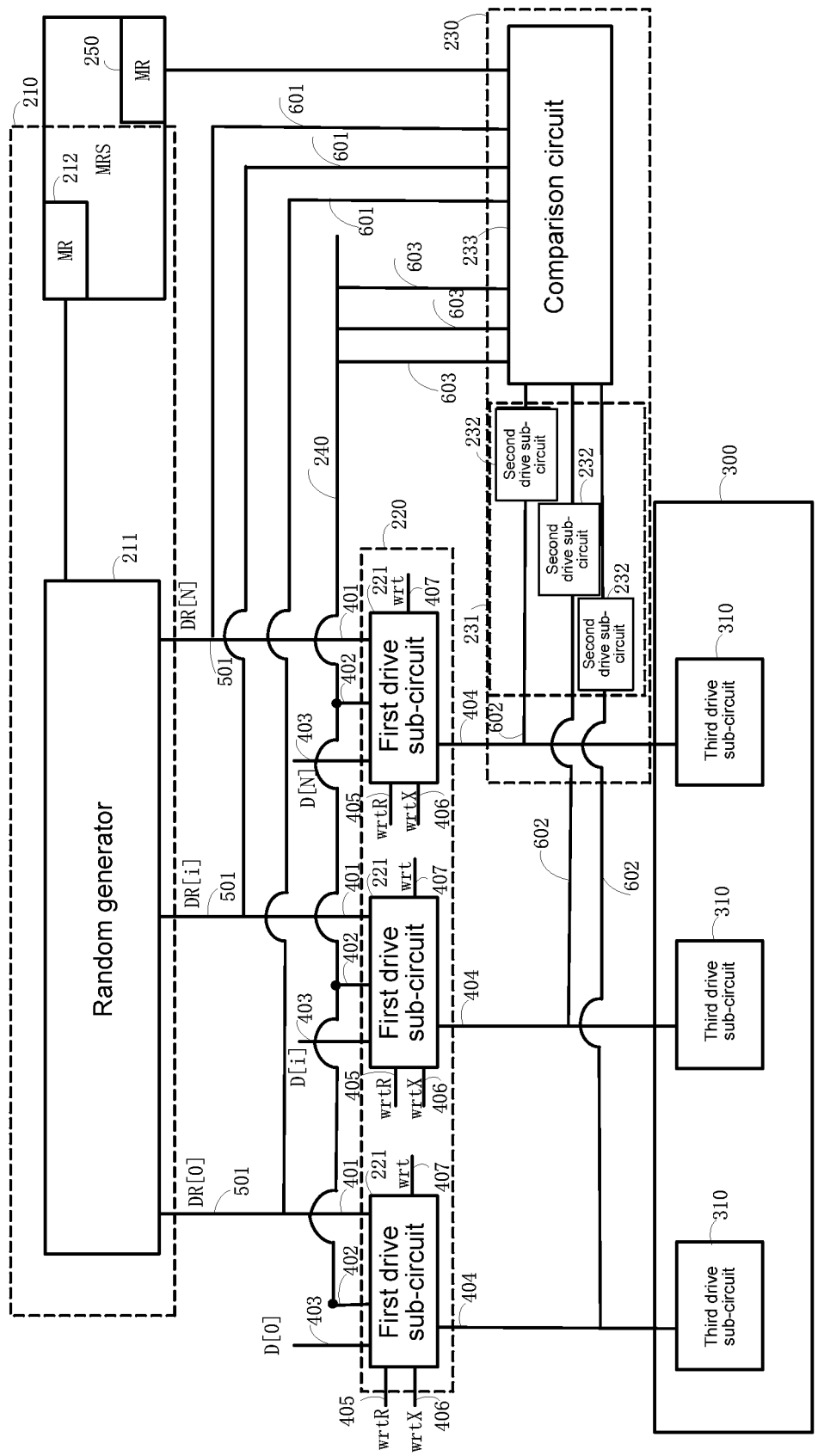
FIG. 4 is a schematic structural diagram of a detection circuit according to another embodiment of the present disclosure.

Referring to FIG. 4, one mode register is selected from a plurality of mode registers reserved in a mode register system (Mode Register System, MRS for short) in the DDR5 memory, and this mode register is marked as a first mode register 212.

The generation unit 210 includes the first mode register 212 and a random generator 211. The first mode register 212 is provided with an output terminal. The random generator 211 is provided with an input terminal connected to the output terminal of the first mode register 212, and a plurality of output terminals as the plurality of output terminals of the generation unit 210.

The controller of the DDR5 memory generates a mode register write instruction to store trigger data into the first mode register 212. The trigger data may be randomly generated, or may be specified data. The first mode register 212 sends the trigger data to the random generator 211, and the random generator 211 processes the trigger data by using an internally stored random algorithm to generate the random detection data DR.

At least two bits in the random detection data DR are different. That is, the random detection data DR is data that is not all "0" or data that is not all "1". The first mode register 212 stores the trigger data in response to the mode register write instruction, and the controller of the DDR5 memory generates the random data write instruction wrtR to trigger the function of writing random data.

The first drive unit 220 is also provided with a plurality of first control terminals 405 configured to control the plurality of output terminals 404 of the first drive unit to output the random detection data DR when receiving the random data write instruction wrtR.

In the foregoing embodiment, by defining the random data write instruction wrtR, and writing the trigger data into the reserved first mode register 212, the controller of the DDR5 memory is triggered to generate the random data write instruction wrtR. The first mode register 212 inputs the trigger data into the random generator 211, so that the random generator 211 randomly generates the random detection data DR according to the trigger data. The plurality of first input terminals 401 of the first drive unit 220 receive the random detection data DR, and when the plurality of first control terminals 405 receive the random data write instruction wrtR, the plurality of output terminals 404 of the first drive unit are controlled to output the random detection data DR, so as to transmit the random detection data DR to the memory array 300 for storage.

After the random detection data DR is written into the memory array 300, the comparison unit 230 is provided with the plurality of second input terminals 602 to receive the first read data read from the memory array 300, and the plurality of first input terminals 601 to receive the random detection data DR generated by the random generator 211, and is configured to compare the first read data read from the memory array 300 with the random detection data DR outputted by the generation unit 210 to obtain the first comparison result, so as to implement the fault detection on the storage function.

In one embodiment, the controller of the DDR5 memory can set the sixth operation bit OP[6]=1 of the mode register MR21 through the write instruction of the mode register to enable the function of writing repeated data. The first drive unit 220 is also provided with a plurality of second input terminals 402 and a plurality of second control terminals 406. All the second input terminals 402 are connected to a first data transmission line 240, and the first data transmission line 240 simultaneously inputs the same bit of data into the plurality of second input terminals 402 of the first drive unit 220. For example, data "0" or data "1" is simultaneously inputted into the plurality of second input terminals 402 of the first drive unit 220, so as to input repeated detection data into the first drive unit 220. When each second control terminal 406 receives the repeated data write instruction wrtX, each output terminal 404 of the first drive unit 220 is controlled to output repeated detection data, and the memory array 300 stores the repeated detection data. That is, the memory array 300 stores the full "0" data or all "1" data.

Still referring to FIG. 3, the comparison unit 230 further includes a third input terminal 603 connected to the first data transmission line 240, so as to transmit the repeated detection data to the comparison unit 230. After the first drive unit 220 transmits the repeated detection data to the memory array 300 through the output terminals 404 thereof, the comparison unit 230 is also configured to read second read data from the memory array 300 and compare the second read data with the repeated detection data to obtain a second comparison result.

In the foregoing embodiment, the plurality of second input terminals 402 of the first drive unit 220 are connected to the first data transmission line 240, so that the plurality of second input terminals 402 of the first drive unit 220 can simultaneously receive the data "0" or data "1". When the plurality of second control terminals 406 of the first drive unit 220 receive the repeated data write instruction wrtX, each output terminal 404 of the first drive unit is controlled to output the data "0" or data "1", so as to store all "0" data or all "1" data into the memory array 300. After the all "0" data or all "1" data is written into the memory array 300, the comparison unit 230 is provided with the plurality of second input terminals 602 to receive the second read data read from the memory array 300, and the plurality of third input terminals 603 to receive the repeated detection data transmitted from the first data transmission line 240, and is configured to compare the repeated detection data with the second read data to obtain a second comparison result, so as to implement the fault detection on the storage function of the memory.

In one embodiment, still referring to FIG. 3, the first drive unit 220 is also provided with a plurality of third input terminals 403 and a plurality of third control terminals 407. Each of the third input terminals 403 is configured to receive data to be stored. When each of the third control terminals 407 is configured to receive the data write instruction wrt, each output terminal 404 is controlled to output and transmit the data to be stored to the memory array 300, and the memory array 300 stores the data to be stored. When the first comparison result indicates that the storage function is normal and/or the second comparison result indicates that the storage function is normal, the data write instruction wrt is inputted into each third control terminal, so as to write the data to be stored into the memory array 300, thereby ensuring the reliability of data storage.

As shown in FIG. 4, the first drive unit 220 includes a plurality of first drive sub-circuits 221. Each of the first drive sub-circuits 221 is provided with a first input terminal as one of the first input terminals of the first drive unit 220, a second input terminal as one of the second input terminals of the first drive unit 220, a third input terminal as one of the third input terminals of the first drive unit 220, and an output terminal as one of the output terminals of the first drive unit 220.

The first input terminals of the first drive sub-circuits 221 are connected to one output terminal of the random generator 211 and configured to receive one bit Dr[i] of the random detection data DR. The second input terminals of the first drive sub-circuits 221 are connected to the first data transmission line 240, so that the second input terminals of the first drive sub-circuits 221 receive one bit of the repeated detection data, and each bit of the repeated detection data is the data "0" or data "1". The third input terminals of the first drive sub-circuits 221 are configured to receive one bit D[i] in the data to be stored D.

Each of the first drive sub-circuits 221 is also provided with a first control terminal, a second control terminal, and a third control terminal. For each of the first drive sub-circuits 221, when the first control terminal of the first drive sub-circuit 221 receives the random data write instruction wrtR, the first control terminal is controlled to output one bit Dr[i] in the random detection data DR, and the output terminals of the plurality of first drive sub-circuits 221 output all bits in the random detection data DR.

For each of the first drive sub-circuits 221, when the second control terminal of the first drive sub-circuit 221 receives the repeated data write instruction wrtX, the second control terminal is controlled to output one bit in the repeated detection data, and the output terminals of the plurality of first drive sub-circuits 221 output all bits in the repeated detection data.

For each of the first drive sub-circuits 221, when the third control terminal of the first drive sub-circuit 221 receives the data write instruction wrt, the third control terminal is controlled to output one bit in the data to be stored, and the output terminals of the plurality of first drive sub-circuits 221 output all bits in the data to be stored.

The comparison unit 230 includes a second drive unit 231 and a comparison circuit 233. The second drive unit 231 is provided with a plurality of input terminals, a plurality of output terminals, and a plurality of control terminals. The comparison circuit 233 is provided with a plurality of first input terminals, a plurality of second input terminals, and a plurality of third input terminals. The plurality of input terminals of the second drive unit 231 are as the plurality of second input terminals 602 of the comparison unit 230. The comparison circuit 233 is provided with the plurality of first input terminals as the plurality of first input terminals 601 of the comparison unit 230, the plurality of second input terminals connected to the output terminals of the second drive unit 231 in one-to-one correspondence, and the plurality of third input terminals connected to the first data transmission line 240.

After the first drive unit 220 outputs the random detection data DR through the output terminals 404 thereof, and the memory array 300 stores the random detection data DR, the plurality of control terminals of the second drive unit 231 receive the first read data read from the memory cell when receiving a data read instruction Rd, and transmits the first read data to the plurality of second input terminals of the comparison circuit 233. The comparison circuit 233 also receives all the bits in the random detection data DR through the plurality of first input terminals. The comparison circuit 233 is configured to compare the first read data with the random detection data DR to obtain the first comparison result.

After the first drive unit 220 outputs the repeated detection data through the output terminals 404 thereof, and the memory array 300 stores the repeated detection data, the plurality of control terminals of the second drive unit 231 receive the second read data read from the memory cell when receiving the data read instruction Rd, and transmits the second read data to the plurality of second input terminals of the comparison circuit 233. The comparison circuit 233 also receives each bit in the repeated detection data through the plurality of third input terminals. The comparison circuit 233 is configured to compare the second read data with the repeated detection data to obtain the second comparison result.

The second drive unit 231 includes a plurality of second drive sub-circuits 232. Each of the second drive sub-circuits 232 is provided with an input terminal as one of the input terminals of the second drive unit 231, an output terminal as one of the output terminals of the second drive unit 231, and a control terminal as one of the control terminals of the second drive unit 231. The input terminal of one of the second drive sub-circuits 232 receives one bit of the first read data or one bit of the second read data read from the memory array 300. When the control terminal of one of the second drive sub-circuits 232 receives the data read instruction Rd, the output terminal of one of the second drive sub-circuits 232 receives outputs one bit of the first read data or one bit of the second read data to one of the second input terminals of the comparison circuit 233.

In the foregoing technical solution, the plurality of first drive sub-circuits 221 are provided, the output terminal of each of the first drive sub-circuits 221 is connected to the memory array 300, and each of the first drive sub-circuits 221 is provided with a first input terminal, a second input terminal, and a third input terminal, and is also provided with a first control terminal, a second control terminal, and a third control terminal. After the first control terminal of each of the first drive sub-circuits 221 receives the random data write instruction wrtR, one bit Dr[i] in the random detection data DR received by the first input terminal is transmitted into the memory array 300. After the second control terminal of each of the first drive sub-circuits 221 receives the repeated data write instruction wrtX, one bit in the repeated detection data received by the second input terminal is transmitted into the memory array 300. After the third control terminal of each of the first drive sub-circuits 221 receives the data write instruction wrt, one bit in the data to be stored received by the third input terminal is transmitted into the memory array 300. The comparison unit 230 is provided with the plurality of second drive sub-circuits 232 and the comparison circuit 233, the plurality of second drive sub-circuits 232 read the first read data or the second read data from the memory array 300, and the comparison circuit 233 compares the data to obtain a detection result of data storage.

In one embodiment, the memory array 300 includes a plurality of third drive units 310, the plurality of output terminals of the first drive unit 220 are connected to the plurality of third drive units 310 in one-to-one correspondence, and the plurality of input terminals of the second drive unit 231 are connected to the plurality of third drive units 310 in one-to-one correspondence. The first drive unit 220 receives the random detection data DR, the repeated detection data, or the data to be stored, and outputs, through the plurality of output terminals 404 thereof, all the bits in the random detection data DR, all the bits in the repeated detection data, or all the bits in the data to be stored. That is, one of the third drive units 310 receives one bit in the random detection data DR, one bit in the repeated detection data, or one bit in the data to be stored. The plurality of third drive units 310 enable each memory cell in the memory array 300 to store all the bits in the random detection data DR, all the bits in the repeated detection data, or all the bits in the data to be stored. Each of the third drive units 310 is also configured to transmit one bit of data stored in the memory array 300 to the corresponding input terminal of the second drive unit 231, so that the second drive unit 231 transmits the first read data or the second read data to the comparison circuit 233.

The comparison circuit 233 is specifically configured to compare bit by bit the first read data read from the memory array 300 with the random detection data DR to obtain a comparison result of each bit, output a first comparison result having a normal function of storing random data when indicating that the comparison results of each bit are the same, and output a first comparison result having an abnormal function of storing random data when indicating that the comparison results of each bit are different.

The comparison circuit 233 is specifically configured to compare bit by bit the second read data read from the memory array 300 with the repeated detection data to obtain a comparison result of each bit, output a second comparison result having normal output and storage functions when indicating that the comparison results of each bit are the same, and output a second comparison result having abnormal output and storage functions when indicating that the comparison results of each bit are different.

In one embodiment, one mode register is selected from a plurality of mode registers reserved in the DDR5 memory, and this mode register is taken as a second mode register

250. The second mode register 250 is provided with an input terminal connected to the output terminal of the comparison unit 230, and configured to store the first comparison result and the second comparison result. The first comparison result and/or the second comparison result are stored in the second mode register 250 and read by using a mode register read instruction, and a detection result of the storage function of the memory array 300 is obtained on the basis of the read first comparison result and/or the read second comparison result.

Figure 5:
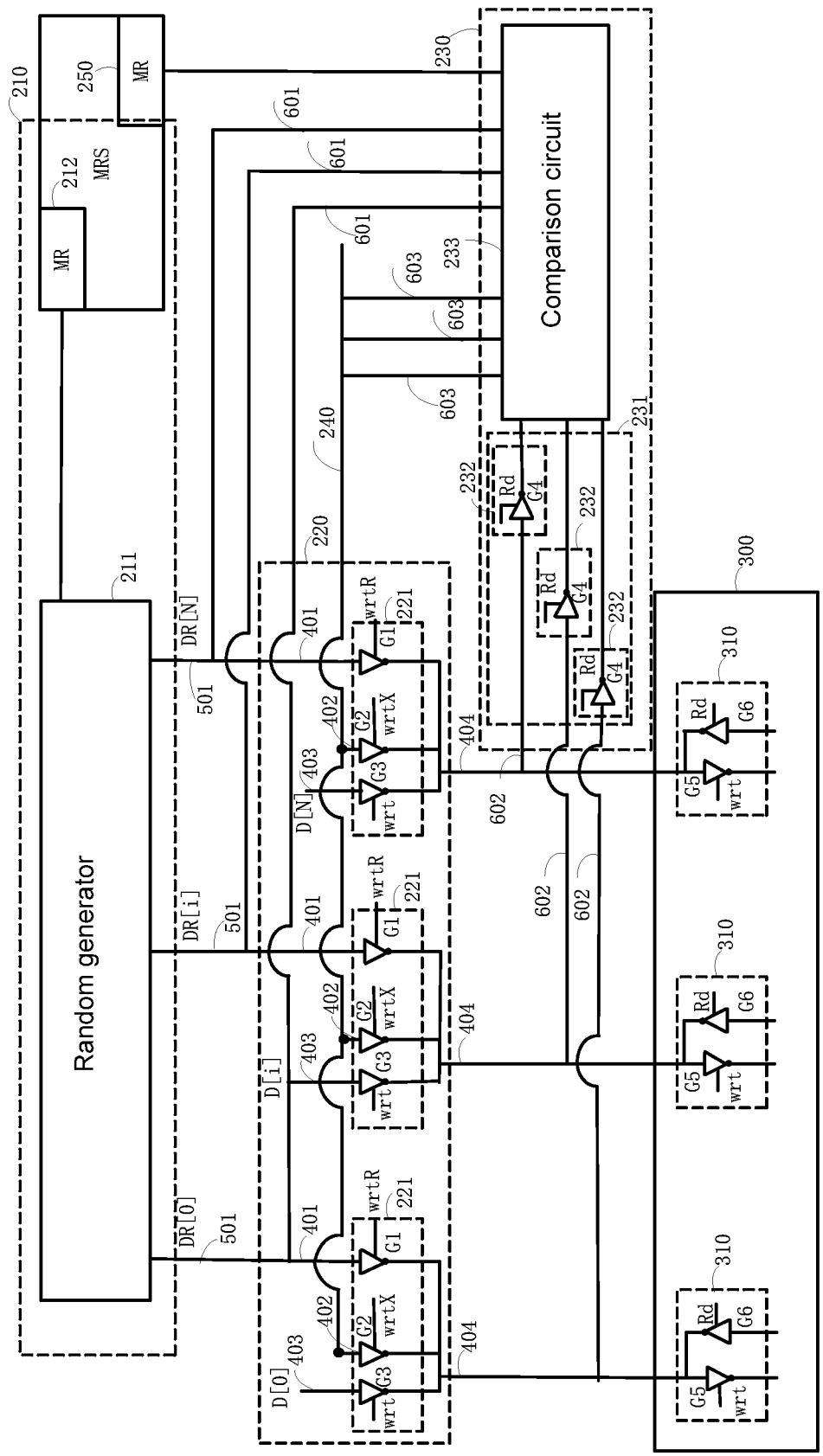
FIG. 5 is a schematic structural diagram of a detection circuit according to another embodiment of the present disclosure.

As shown in FIG. 5, each of the first drive sub-circuits 221 includes a first controllable inverter G1, a second controllable inverter G2, and a third controllable inverter G3. Each of the controllable inverters is provided with a control terminal, an input terminal, and an output terminal.

The first controllable inverter G1 is provided with the control terminal as the first control terminal of each of the first drive sub-circuits 221, the input terminal as the first input terminal of each of the first drive sub-circuits 221, and the output terminal as the output terminal of each of the first drive sub-circuits 221. The input terminal of the first controllable inverter G1 is connected to one output terminal of the random generator 211 and configured to receive one bit Dr[i] of the random detection data DR outputted by the random generator 211. When the control terminal of the first controllable inverter G1 receives the random data write instruction wrtR, the random data write instruction wrtR is outputted by the output terminal of the first controllable inverter G1.

The second controllable inverter G2 is provided with the control terminal as the second control terminal of each of the first drive sub-circuits 221, the input terminal as the second input terminal of each of the first drive sub-circuits 221, and the output terminal connected to the output terminal of the first controllable inverter G1. The input terminal of the second controllable inverter G2 is connected to the first data transmission line 240, and configured to receive one bit of the repeated detection data transmitted by the first data transmission line 240. When the control terminal of the second controllable inverter G2 receives the repeated data write instruction wrtX, the repeated data write instruction wrtX is outputted by the output terminal of the second controllable inverter G2.

The third controllable inverter G3 is provided with the control terminal as the third control terminal of each of the first drive sub-circuits 221, the input terminal as the third input terminal of each of the first drive sub-circuits 221, and the output terminal connected to the input terminal of the first controllable inverter G1. The input terminal of the third controllable inverter G3 is configured to receive one bit of the data to be stored. When the control terminal of the third controllable inverter G3 receives the data write instruction, the data write instruction wrt is outputted by the output terminal of the third controllable inverter G3.

Each of the third drive units 310 includes a fifth controllable inverter G5 and a sixth controllable inverter G6. Each of the controllable inverters is provided with a control terminal, an input terminal, and an output terminal. The input terminal of the fifth controllable inverter G5 is connected to the output terminal of the sixth controllable inverter G6. The input terminal of the fifth controllable inverter G5 is connected to the output terminal of the first controllable inverter G1, the output terminal of the second controllable inverter G2, and the output terminal of the third controllable inverter G3 in the same first drive sub-circuit 221. When receiving the data write instruction wrt, the fifth controllable inverter G5 writes one bit of the random detection data DR, one bit of the repeated detection data, or one bit of the data to be stored into the memory cell of the memory array 300.

Each of the second drive sub-circuits 232 includes a fourth controllable inverter G4. The fourth controllable inverter G4 is provided with a control terminal as the control terminal of each of the second drive sub-circuits 232, an input terminal as the input terminal of each of the second drive sub-circuits 232, and an output terminal as the output terminal of each of the second drive sub-circuits 232. The input terminal of the fourth controllable inverter G4 is connected to the output terminal of the first controllable inverter G1, the output terminal of the second controllable inverter G2, and the output terminal of the third controllable inverter G3 in the same first drive sub-circuit 221. The output terminal of the fourth controllable inverter G4 is connected to one of the second input terminals of the comparison circuit 233.

In the detection circuit shown in FIG. 5, the trigger data is written into the first mode register 212 through the mode register write instruction, so as to enable the function of writing random data. The data transmission process is described below by writing 8-bit trigger data into the first mode register 212, and the random generator 211 randomly generating 128-bit random detection data DR according to the trigger data as an example:

One of the first controllable inverters G1 receives one bit DR[i] in the 128-bit random detection data DR. 128 first controllable inverters G1 receive the 128-bit random detection data DR outputted by the random generator 211. The control terminals of the 128 first controllable inverters G1 all output the random detection data DR when receiving the random data write instruction wrtR. The input terminals of the fifth controllable inverters G5 receive one bit in the random detection data DR, and when the fifth controllable inverters G5 receive the data write instruction wrt, the 128-bit random detection data DR is stored into each memory cell in the memory array 300.

When the control terminals of the 128 sixth controllable inverters G6 all receive the data read instruction Rd, the 128 sixth controllable inverters G6 read the data in the memory cell, and transmit the first read data to the 128 fourth controllable inverters G4. That is, one of the sixth controllable inverters G6 transmits one bit in the first read data to the fourth controllable inverters G4. The 128 fourth controllable inverters G4 transmit the first read data to the comparison circuit 233. One of the first input terminals of the comparison circuit 233 receives one bit in the random detection data DR, and the 128-bit random detection data DR is compared with the 128-bit first read data bit by bit to obtain a comparison result of 128-bit data. If the comparison results of the 128-bit data all indicate that the data is consistent, it means that the storage function is normal. If any one of the comparison results of the 128-bit data indicates that the data is inconsistent, it means that the storage function is malfunctioning.

The process of writing the repeated detection data into the memory array 300 is the same as the above process of writing the random detection data into the memory array 300, except that the first data transmission line 240 transmits the repeated detection data to the input terminal of each of the second controllable inverters G2, the repeated detection data is outputted by the output terminals of the plurality of second controllable inverters G2, the plurality of third input terminals of the comparison circuit receive the repeated detection data, and the plurality of fourth controllable inverters G4 receive the second read data and transmit the second read data to the comparison circuit, so that the comparison circuit compares bit by bit the second read data with the repeated detection data to obtain the second comparison result.

In the foregoing technical solution, each of the first drive sub-circuits 221 includes a first controllable inverter, a second controllable inverter, and a third controllable inverter. The output terminals of the three controllable inverters are connected to one another. The first controllable inverter is configured to control the output of one bit in the random detection data DR. The second controllable inverter is configured to control the output of one bit in the repeated detection data. The third controllable inverter is configured to control the output of one bit in the data to be stored. By simultaneously controlling the first controllable inverter in each of the first drive sub-circuits 221 to output one bit in the random detection data DR, all bits in the random detection data DR are outputted to the memory array 300. By simultaneously controlling the second controllable inverter in each of the first drive sub-circuits 221 to output one bit in the repeated detection data, all bits in the repeated detection data are outputted to the memory array 300. By simultaneously controlling the third controllable inverter in each of the first drive sub-circuits 221 to output one bit in the data to be stored, all bits in the data to be stored are outputted to the memory array 300. Each of the third drive units 310 is provided with two controllable inverters, one is configured to control the storage of the data into the memory array 300, and the other one is configured to control the read of the data from the memory array 300. Each of the second drive sub-circuits 232 includes a fourth controllable inverter for receiving the data that is stored in the memory array 300 and transmitted by the sixth controllable inverter, and transmitting the data to the comparison circuit 233.

At last, it should be noted that the above embodiments are only used for describing the technical solutions of the present disclosure, and are not intended to limit the present disclosure. Although the present disclosure is described in detail with reference to the above embodiments, those of ordinary skill in the art should understand that they can still make modifications to the technical solutions described in the above embodiments, or make equivalent substitutions for some or all technical features therein. However, these modifications or substitutions do not make the essence of the corresponding technical solutions depart from the scope of the technical solutions of the embodiments of the present disclosure.

The invention claimed is:

1. A detection circuit, comprising:
   a generation unit provided with a plurality of output terminals and configured to generate random detection data and output one bit of the random detection data through each output terminal of the plurality of output terminals of the generation unit;
   a first drive unit provided with a plurality of first input terminals connected to the plurality of output terminals of the generation unit in one-to-one correspondence and a plurality of output terminals connected to a memory array, and the first drive unit configured to transmit the random detection data to the memory array, wherein the memory array is configured to store the random detection data; and
   a comparison unit provided with a plurality of first input terminals connected to the plurality of output terminals of the generation unit in one-to-one correspondence and a plurality of second input terminals connected to the memory array, and the comparison unit configured to compare first read data read from the memory array with the random detection data generated by the generation unit to obtain a first comparison result;
   wherein the generation unit comprises:
      a first mode register provided with an output terminal and configured to store trigger data in response to a mode register write instruction; and
      a random generator provided with an input terminal connected to the output terminal of the first mode register and a plurality of output terminals as the plurality of output terminals of the generation unit, and configured to randomly generate the random detection data according to the trigger data.

2. The detection circuit according to claim 1, wherein at least two bits of the random detection data are different.

3. The detection circuit according to claim 2, wherein the comparison unit comprises:
   a second drive unit provided with a plurality of input terminals as the plurality of second input terminals of the comparison unit, a plurality of output terminals, and a plurality of control terminals configured to transmit the first read data read from the memory array when receiving a data read instruction; and
   a comparison circuit provided with a plurality of first input terminals as the plurality of first input terminals of the comparison unit and a plurality of second input terminals connected to the plurality of output terminals of the second drive unit in one-to-one correspondence, and the comparison circuit configured to compare the first read data read from the memory array with the random detection data generated by the generation unit to obtain the first comparison result.

4. The detection circuit according to claim 1, wherein the first drive unit is also provided with:
   a plurality of first control terminals configured to control the plurality of output terminals of the first drive unit to output the random detection data when receiving a random data write instruction.

5. The detection circuit according to claim 4, wherein the first drive unit is also provided with:
   a plurality of second input terminals and a plurality of second control terminals, each second input terminal of the plurality of second input terminals of the first drive unit connected to a first data transmission line and configured to simultaneously receive repeated detection data, and each second control terminal of the plurality of second control terminals configured to control the plurality of output terminals of the first drive unit to output the repeated detection data when receiving a repeated data write instruction.

6. The detection circuit according to claim 5, wherein the first drive unit is also provided with:
   a plurality of third input terminals and a plurality of third control terminals, each third input terminal of the plurality of third input terminals configured to receive data to be stored, and each third control terminal of the plurality of third control terminals configured to control the plurality of output terminals of the first drive unit to output the data to be stored when receiving a data write instruction.

7. The detection circuit according to claim 6, wherein the first drive unit comprises a plurality of first drive sub-circuits; and
   each of the plurality of first drive sub-circuits is provided with a first input terminal as one of the plurality of first input terminals of the first drive unit, a second input terminal as one of the plurality of second input terminals of the first drive unit, a third input terminal as one of the plurality of third input terminals of the first drive unit, and an output terminal as one of the plurality of output terminals of the first drive unit.

8. The detection circuit according to claim 7, wherein the first drive sub-circuit comprises:
a first controllable inverter provided with a control terminal as a first control terminal of the first drive sub-circuit, an input terminal as the first input terminal of the first drive sub-circuit, and an output terminal as the output terminal of the first drive sub-circuit;
a second controllable inverter provided with a control terminal as a second control terminal of the first drive sub-circuit, an input terminal as the second input terminal of the first drive sub-circuit, and an output terminal connected to the output terminal of the first controllable inverter; and
a third controllable inverter provided with a control terminal as a third control terminal of the first drive sub-circuit, an input terminal as the third input terminal of the first drive sub-circuit, and an output terminal connected to the output terminal of the first controllable inverter.

9. The detection circuit according to claim 5, wherein the comparison unit further comprises a plurality of third input terminals connected to the first data transmission line, and the comparison unit is also configured to compare second read data read from the memory array with the repeated detection data to obtain a second comparison result.

10. The detection circuit according to claim 1, wherein the comparison unit comprises:
a second drive unit provided with a plurality of input terminals as the plurality of second input terminals of the comparison unit, a plurality of output terminals, and a plurality of control terminals configured to transmit the first read data read from the memory array when receiving a data read instruction; and
a comparison circuit provided with a plurality of first input terminals as the plurality of first input terminals of the comparison unit and a plurality of second input terminals connected to the plurality of output terminals of the second drive unit in one-to-one correspondence, and the comparison circuit configured to compare the first read data read from the memory array with the random detection data generated by the generation unit to obtain the first comparison result.

11. The detection circuit according to claim 10, wherein the second drive unit comprises a plurality of second drive sub-circuits; and
each of the plurality of second drive sub-circuits is provided with an input terminal as one of the plurality of input terminals of the second drive unit, an output terminal as one of the plurality of output terminals of the second drive unit, and a control terminal as one of the plurality of control terminals of the second drive unit.

12. The detection circuit according to claim 11, wherein the second drive sub-circuit comprises:
a fourth controllable inverter provided with a control terminal as the control terminal of the second drive sub-circuit, an input terminal as the input terminal of the second drive sub-circuit, and an output terminal as the output terminal of the second drive sub-circuit.

13. The detection circuit according to claim 10, wherein the comparison circuit is specifically configured to:
compare bit by bit the first read data read from the memory array with the random detection data generated by the generation unit to obtain a comparison result of each bit.

14. The detection circuit according to claim 1, further comprising:
a second mode register provided with an input terminal connected to an output terminal of the comparison unit, and the second mode register configured to store the first comparison result and a second comparison result.

15. The detection circuit according to claim 1, wherein the memory array comprises a plurality of third drive units, the plurality of output terminals of the first drive unit are connected to the plurality of third drive units in one-to-one correspondence, and a plurality of input terminals of a second drive unit are connected to the plurality of third drive units in one-to-one correspondence.

* * * * *